(12) United States Patent
Hinterstoisser et al.

(10) Patent No.: US 11,704,561 B2
(45) Date of Patent: Jul. 18, 2023

(54) METHOD FOR REALIZING A NEURAL NETWORK

(71) Applicant: Siemens Aktiengesellschaft, Munich (DE)

(72) Inventors: Thomas Hinterstoisser, Bisamberg (AT); Martin Matschnig, Tulln (AT); Herbert Taucher, Vienna (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 347 days.

(21) Appl. No.: 16/955,356

(22) PCT Filed: Dec. 12, 2018

(86) PCT No.: PCT/EP2018/084487
§ 371 (c)(1),
(2) Date: Jun. 18, 2020

(87) PCT Pub. No.: WO2019/121206
PCT Pub. Date: Jun. 27, 2019

(65) Prior Publication Data
US 2021/0097388 A1   Apr. 1, 2021

(30) Foreign Application Priority Data
Dec. 20, 2017   (EP) .................................. 17208770

(51) Int. Cl.
*G06F 30/323*     (2020.01)
*G06F 30/327*     (2020.01)
(Continued)

(52) U.S. Cl.
CPC ............ *G06N 3/08* (2013.01); *G06F 30/323* (2020.01); *G06F 30/327* (2020.01); *G06N 3/063* (2013.01)

(58) Field of Classification Search
USPC ............................................... 706/15
See application file for complete search history.

(56) References Cited

U.S. PATENT DOCUMENTS

2015/0269485 A1* 9/2015 Julian ............... G06N 3/049
706/25

FOREIGN PATENT DOCUMENTS

CN         101246508      8/2008
EP         0595889 B1     10/1997

OTHER PUBLICATIONS

Eldredge, J. Getal: "Run-Time Reconfiguration: A Method for Enhancing the Functional Density of SRAM-Based FPGAS", Journal of VLSI Signal Processing Systems for Signal, Image, and Video Technology, Springer, New York, NY, US, vol. 12, No. 1, Jan. 1, 1996 (Jan. 1, 1996), pp. 67-85 (Year: 1996).*

(Continued)

*Primary Examiner* — Bryce M Aisaka
(74) *Attorney, Agent, or Firm* — Cozen O'Connor

(57) ABSTRACT

A method for realizing an artificial neural network via an electronic integrated circuit (FPGA), wherein artificial neurons grouped into different interlinked layers for the artificial neural network, where a functional description is created for each neuron of the artificial neural network, taking into account a specifiable starting weighting, a synthesis is performed for each neuron based on the associated functional description with the associated specified starting weighting, a network list is determined as the synthesis result, in which at least a base element and a starting configuration belonging to the base element are stored for each neuron, a base element is formed as a lookup table (LUT) unit and an associated dynamic configuration cell, in which a current configuration for the LUT unit or the base element is stored, and where the network list is implemented (Continued)

as a starting configuration of the artificial neural network in the electronic integrated circuit.

7 Claims, 3 Drawing Sheets

(51) Int. Cl.
    *G06N 3/08* (2023.01)
    *G06N 3/063* (2023.01)

(56) References Cited

OTHER PUBLICATIONS

Cong Jason et al: "High-Level Synthesis for FPGAs: From Prototyping to Deployment", IEEE Transactions on Computer Aided Design of Integrated Circuits and Systems, IEEE, Service Center, Piscataway, NJ, US, vol. 30, No. 4, pp. 473-491, pp. 473-488, right column, paragraph 4; 2011.

Gomperts Alexander et al: "Development and Implementation of Parameterized FPGA-Based General Purpose Neural Networks for Online Applications", IEEE Transactions on Industrial Informatics, IEEE Service Center, New York, NY, US, vol. 7, No. 1, pp. 78-89, pp. 78-88, right column, paragraph 2; 2011.

Gorgon Marek et al: "Neural Network Implementation in Reprogrammable FPGA Devices—An Example for MLP", Artificial Intelligence and Soft Computing—ICAISC 2006 Lecture Notes in Computer Science; Lecture Notes in Artificial Intelligence; LNCS, Springer, Berlin, DE, pp. 19-28, paragraph 2; 2006.

Eldredge James G et al: "Run-Time Reconfiguration: A Method for Enhancing the Functional Density of SRAM-Based FPGAS", Journal of VLSI Signal Processing Systems for Signal, Image, and Video Technology, Springer, New York, NY, US, vol. 12, No. 1, pp. 67-85; pp. 67-84, right column, paragraph 1; 1996.

PCT International Search Report dated Mar. 15, 2019 based on PCT/EP2018/084487 filed Dec. 12, 2018.

EP Search Report dated Jun. 15, 2018 based on EP17208770 filed Dec. 20, 2017.

* cited by examiner

METHOD FOR REALIZING A NEURAL NETWORK

CROSS-REFERENCE TO RELATED APPLICATIONS

This is a U.S. national stage of application No. PCT/EP2018/084487 filed 12 Dec. 2018. Priority is claimed on European Application No. 17208770 filed 20 Dec. 2017, the content of which is incorporated herein by reference in its entirety.

BACKGROUND OF THE INVENTION

1. Field of the Invention

The invention generally relates to the field of artificial neural networks and, more particularly, to a method for realizing an artificial neural network via an electronic integrated circuit, i.e., via a Field Programmable Gate Array (FPGA), where the artificial neural network is constructed of artificial neurons, which are grouped into different layers and linked to each other.

2. Description of the Related Art

Nowadays, artificial neural networks are frequently used in applications in which there is no, or only a small amount of, explicit systematic knowledge available about the problem to be solved, or for which it is difficult to derive a suitable algorithm that can be executed by a computer. Applications of this kind exist, e.g., in fields such as text recognition, image recognition and pattern recognition, rapid decision-making and/or classification tasks.

In principle, an artificial neural network represents a simulation of biological neural systems with their associative way of operating. The outstanding property of the artificial neural network consists in particular in its ability to learn, i.e., set problems, such as text recognition, image recognition or pattern recognition or rapid decision-making, are solved based on trained knowledge. An artificial neural network consists of a large number of artificial neurons that mimic human brain cells, for example. The neurons are grouped into different layers in the neural network and are characterized by a high degree of interlinking. At least one input layer for receiving raw data, and an output layer, which provides the conclusion or the result determined by the neural network, are provided as layers, for example. One or more "hidden" layers may be provided between those layers, which determine and provide intermediate results. An exemplary neural network and example applications in the field of pattern recognition or speech recognition are known, e.g., from the publication EP 0 595 889 B1.

In order that it can be used for a specified task (e.g., text recognition, image recognition or pattern recognition, decision-making or a classification task), the neural network must be trained during a training phase. During this training phase, the neural network is trained, using e.g. specified training data and/or samples, to supply an answer that is correct in relation to the task. In this process, starting from, e.g., specifiable or randomly selected values for a starting weighting or for starting weighting factors assigned to the neurons, the weighting or weighting factor and possibly a bias value for the respective neuron are modified in each training cycle. The results of the neural network obtained in the respective training cycle are then compared with, e.g., reference data/samples until a desired results quality has been achieved.

The parallel processing structure means that a realization of neural networks purely in software executed by a CPU or GPU is often hardly practicable, especially because the training phase for the neural network is usually relatively computationally intensive. Often, a high degree of computing power is necessary, where the processing usually executes rather slowly. With a realization of neural networks executed directly on a hardware platform, integrated electronic circuits are increasingly being used. Field Programmable Gate Arrays (FPGAs) are especially suitable for the realization of artificial neural networks, because the structure and flexibility of FPGAs mean that they allow a flexible and parallel implementation.

FPGAs are programmed by defining functional structures and by stipulating structural specifications. This means that the circuit structures of an FPGA may be specified and/or changed after its manufacture by means of data (e.g,. structural specifications or circuit diagrams) loaded into the FPGA. FPGAs can therefore be used flexibly, and different circuits and functions may be realized or implemented via programming.

For the implementation of a neural network via an integrated electronic circuit, especially via an FPGA, a design of the neurons and how they are to be linked together, and thus a structure for the neural network to be realized, is created in a design phase, for example. In this process, for example, the individual neurons are remodeled with the aid of a hardware description language (e.g., HDL, Very High Speed Integrated Circuit Hardware Description Language (VHDL), or Verilog). With synthesis, this design of the respective neurons is mapped onto the resources of the integrated electronic circuit. That is, based on a description of the respective neurons created via a hardware description language, what is known as a netlist is generated, via which the respective neurons are mapped onto available resources of the integrated electronic circuit or FPGA. Typically, a relatively large number of resources are required (such as lookup tables, digital signal processors (DSPs), gates, shift registers or memory blocks) for the hardware-based implementation of a neural network or individual neurons. Implementations of artificial neural networks via FPGAs are, for example, the following publications: Nurviadhi, E. et al.: Accelerating Binarized Neural Networks: *Comparison of FPGA, CPU, GPU and ASIC,* 2016, IEEE; or Haruyoshi Yonekawa and Hiroki Nakahara: *On-chip Memory Based Binarized Convolutional Deep Neural Network Applying Batch Normalization Free Technique on an FPGA,* 2017, IEEE p. 98-105.

Training of the neural network with all layers and associated neurons may be performed, for example, directly on the hardware platform of the integrated electronic circuit or FPGA. For this purpose, for example, the netlist of the neurons or neural network obtained from the synthesis is transferred to the hardware platform or integrated electronic circuit (e.g., FPGA). That is, the neurons are simulated via the resources specified in the netlist (e.g., lookup tables, digital signal processors (DSPs), gates, shift registers or memory blocks). In this process, the corresponding current weightings/weighting factors of the artificial neurons in the respective training cycle are stored, e.g., in associated memory blocks (e.g., block RAMs) of the integrated electronic circuit or FPGA. For each new training cycle, for example, the respective current weightings, or the weightings adapted based on the previous training result, must be loaded directly into the corresponding memory blocks until optimal weightings or optimal weighting factors are found for the specified task. For the live operation, these are then retained as fixed values in the memory blocks of the hardware-based implementation of the respective neurons.

Alternatively, the training of the artificial neural network may also be performed via a software model, which is created, for example, based on the netlist and is in principle identical to the hardware-based realization in the integrated electronic circuit. With the aid of training data and/or samples, using the software model the optimal weightings or weighting factors for the neurons are determined, e.g., starting from a specifiable or random starting weighting. After the optimal weightings have been determined, the trained neural network is transferred to the hardware platform of the integrated electronic circuit. The weightings of the respective neurons are then stored, e.g., as fixed values in the memory blocks of the hardware-based implementation of the respective neurons.

In both exemplary training methods for a neural network implemented in an integrated electronic circuit, the connections of the neurons are typically fixed. Only the memory blocks in which the weightings are stored may be refreshed dynamically during the training phase, for example. If it is established during the training phase, for example, that a change in the connection of the neurons is necessary, then this change may only be achieved via a further synthesis. IThat is, changes in the structure of the neural network or in the connection of the neurons entail relatively large outlay.

Furthermore, storing the weightings in dedicated memory blocks in the hardware-based implementation of the respective neurons means that several clock cycles are required for a calculation of what is known as the weight matrix of the respective neuron, for example (e.g., reading out the stored weighting or calculating the weight matrix). This has a disadvantageous effect in particular on the processing speed, both in the training phase and also during live use of the neural network.

SUMMARY OF THE INVENTION

In view of the foregoing, it is therefore an object of the invention to provide a method for realizing an artificial neural network via an electronic integrated circuit, i.e., via a Field Programmable Gate Array (FPGA), via which a lower resource consumption and higher processing speed are achieved without great outlay and more flexible handling is made possible during the training phase.

This and other objects and advantages are achieved in accordance with the invention by a method for realizing an artificial neural network via an integrated electronic circuit, in particular via a Field Programmable Gate Array (FPGA), where the method comprises, for each neuron of the artificial neural network, initially creating a functional description, taking into account a specifiable starting weighting. A synthesis is then performed for the respective neuron based on the respective functional description with the associated specifiable starting weighting. A netlist is created as the synthesis result, in which netlist at least one base element and a starting configuration belonging to the at least one base element are stored for each neuron. In this process, the base element is formed by a lookup table (LUT) unit and an associated dynamic configuration cell of the integrated electronic circuit, where a respective current configuration for the associated LUT unit is stored in the configuration cell. The netlist is then loaded and implemented, as the starting configuration of the artificial neural network, into the electronic integrated circuit, in particular into the FPGA.

The main aspect of the subject matter of the invention is that a starting weighting for the respective neurons is additionally taken into consideration as early as during the design or functional description. Here, a maximum possible value for the weighting or weighting factors of the respective neuron may be used as the starting weighting, for example. Furthermore, by mapping the respective neurons onto at least one base unit, the demand per neuron for hardware resources of the electronic integrated circuit is significantly reduced. In particular, no additional memory block is required, e.g., a block RAM, for storing the current weighting of the respective neuron. The weighting is taken into consideration or integrated as early as during the functional description of the respective neuron or during the respective configuration for the at least one base unit upon which the neuron is mapped. The configuration for the base element used in each case is stored in this process in a dynamic configuration cell associated with the base element, which is associated with the configuration memory of the electronic integrated circuit and the content thereof is loaded into the LUT unit of the base element when the electronic integrated circuit is started up. In this context, in digital circuit technology or in electronic integrated circuits, a LUT unit is a logic unit, via which a desired function (e.g., AND, OR, NOR, XOR or even more complex functions) can be implemented by loading a corresponding associated configuration, in particular in the form of a logic table, from the associated configuration memory cell when the circuit is started up.

Furthermore, removing the need for additional memory blocks (e.g. block RAMs) for the weightings of the neurons that must be read out during operation of the neural network, and omitting a calculation of a weighting matrix for the respective neuron, also increases the processing speed of the neural network.

In one preferred embodiment of the method in accordance with the invention, during the creation of the functional description, taking into account the specifiable starting weighting of the respective neuron, a functionality of the respective neuron is reduced such that the respective neuron is mapped onto one base element. In this way, the resource demand of a neuron may be significantly reduced. In this process, the function of the neuron is ideally configured or mapped as an overall function with the associated weighting in the LUT unit of the base element via the configuration cell, when the electronic integrated circuit or FPGA is started up.

In a particularly favorable embodiment of the method in accordance with the invention, starting from the starting configuration of the artificial neural network implemented in the electronic integrated circuit, a training phase is outperformed in which the starting configuration and/or a respective current configuration of at least one base element and/or at least one neuron is changed. The use of the base elements consisting of a LUT unit and an associated dynamic configuration cell allows changes to be made very easily and flexibly during the training phase. A functional embodiment and/or a weighting of at least one neuron, which is stored as functional content in the LUT unit during operation of the electronic integrated circuit, may be varied very easily via the configuration cell. The configuration cell is then used as training memory for the respective neuron or base elements during the training phase of the artificial neural network. Ideally, the training phase of the artificial neural network is performed directly on the circuit or during live operation of the circuit. If the optimal configuration of the neural network is found in order to solve the particular task (e.g., text recognition, image recognition or pattern recognition or a decision-making task), then the particular configuration may be fixed in the configuration cells of the base elements, for example.

In this context, it is advantageous if fixed, specified test data and/or test samples are used in the training phase of the artificial neural network. Output data of the artificial neural network obtained with the test data and/or the test sample is compared with specified reference data. A change to the respective current configuration of at least one base unit and/or at least one neuron is performed iteratively until the output data of the artificial neural network obtained with the test data and/or the test sample corresponds to the specified reference data within a specifiable tolerance. During the training phase, by changing one or more neurons, an iterative approximation can be obtained until an optimal solution to the task has been achieved.

Furthermore, ideally a specially designated interface of the electronic integrated circuit or FPGA is used during the training phase of the artificial neural network to feed in a change to the starting configuration and/or the respective current configuration of the at least one base unit and/or the at least one neuron. In this way, changes to individual neurons can be very easily loaded into the corresponding configuration cells of the corresponding base elements during the training phase. When the electronic integrated circuit is started up, the changes to individual neurons are then loaded into the respective LUT units of the corresponding base elements and the new or changed configuration of the artificial neural network can be tested very quickly.

It is advantageous if a memory unit of the configuration memory of the electronic integrated circuit is used as the configuration cell for storing the respective current configuration of the respective base element. The configuration memory of the electronic integrated circuit, in particular the FPGA, is typically a memory unit in which the respective current configuration is stored. When the circuit or FPGA is started up, this configuration is then loaded and specifies the current functionality of the circuit, use of resources, and linking of the resources used respectively. As a result, resources are conserved, on the one hand, and on the other hand changes may be integrated easily during the training phase.

It is favorable if the configuration cell for storing the respective current configuration of the respective base element is formed as static RAM. A static RAM is an electronic volatile memory module, which contains an item of data information stored therein as long as the operating voltage is applied. Alternatively, the configuration cells may also be formed as Flash memory, which enables a non-volatile storage with simultaneously low power consumption.

Ideally, the functional description of the respective neuron of the artificial neural network is created in particular in a hardware description language (HDL).

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will now be described by way of example making reference to the accompanying figures, in which.

DETAILED DESCRIPTION OF THE EXEMPLARY EMBODIMENTS

Artificial neural networks mimic natural neural networks. An artificial neural network therefore typically represents a highly simplified abstraction model of a natural neural network, where the artificial neural network is constructed of artificial neurons that are connected to each other in the manner of a network. A structure of an artificial neural network of this type, as is known, e.g., from Rey, Güdnter Daniel; Wender, Karl F.: *Neuronale Netze—Eine Einführung in die Grundlagen, Anwendungen and Datenauswertung* [*Neural Networks—an Introduction to the Basics, Applications and Data Analysis*], 2nd edition, Huber Verlag, 2010, and an exemplary basic structure of an artificial neuron, as presented, e.g., in the publication by Muthuramalingam, A, et al., *Neural Network Implementation Using FPGA: Issues and Application*, International Journal of Electrical and Computer Engineering Vol. 2, No. 12, 2008, will be described in further detail with the aid of FIGS. 1a and 1b.

Figure 1A:
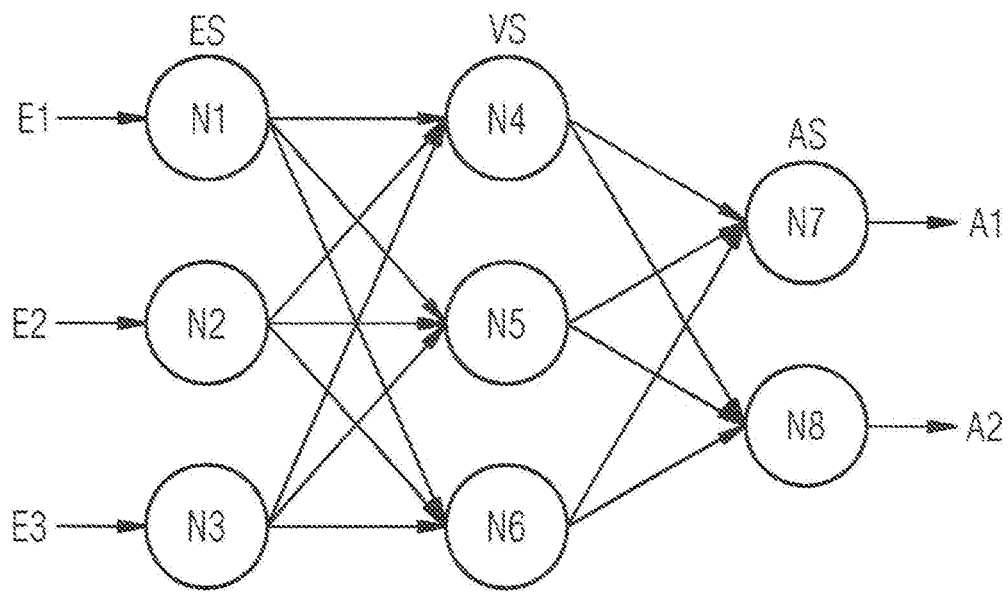
FIG. 1a shows an exemplary and generalized structure of an artificial neural network.

FIG. 1a shows, by way of example, the structure of a multi-layer "feedforward neural network", where the structure of the network is linked directly, for example, to the learning or training methods used and a necessary scope of the neural network depends on the complexity of the particular task to be solved (e.g., text recognition, image recognition or pattern recognition, decision-making or a classification task). The neural network consists of multiple neurons N1 to N8 that are used to receive information from the environment or from other neurons N1 to N8 and to pass it on in modified form to other neurons N1 to N8 or to the environment. For this purpose, the neurons N1 to N8, for example, are grouped into different layers ES, VS, AS and linked to each other. A neural network may comprise, for example, an input layer ES consisting of input neurons N1, N2, N3, one or more hidden layers VS, and an output layer AS with output neurons N7, N8. Signals, stimuli or samples are received by the input layer ES or the input neurons N1, N2, N3 via inputs E1, E2, E3. The outputs of the input neurons N1, N2, N3 are linked to the neurons N4, N5, N6 of the hidden layer VS and the outputs thereof linked to the output neurons N7, N8, with signals or output data then being output via their outputs.

Figure 1B:
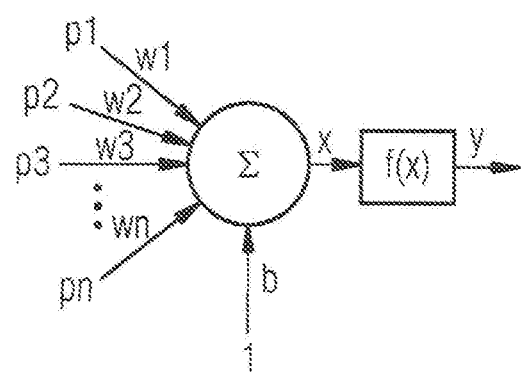
FIG. 1b shows an exemplary and generalized basic structure of an artificial neuron.

FIG. 1b shows, by way of example, a generalized basic structure of an artificial neuron N1 to N8 with n input connections. Via the input connections, the neuron obtains its input values p1, p2, p3, ..., pn, e.g., in the form of signals, stimuli or samples from the environment, or in the form of output data from other neurons. Each of these input values p1, p2, p3, . . . , pn are linked to a weighting or weighting factors w1, w2, w3, . . . , wn. Before a training phase for the neural network, for example, the weighting or the weighting factors w1, w2, w3, . . . , wn may be specified as a starting weighting w1, w2, w3, . . . , wn for the respective neuron, where a maximum possible value for the weighting or weighting factors w1, w2, w3, . . . , wn of the respective neuron may be used as the starting weighting, for example. The weighting w1, w2, w3, . . . , wn may be varied accordingly during the training phase. Furthermore, with an artificial neuron, a "bias input b" may be provided with an input value 1.

The functionality of the neuron, which may be used to create the functional description for a realization by means of an integrated electronic circuit, is described in principle by a transfer function $\Sigma$ and an activation function $f(x)$. With the transfer function $\Sigma$, a network input x of the neuron is calculated with the aid of the weighting w1, w2, w3, . . . , wn of the input values p1, p2, p3, . . . , pn, possibly taking into consideration the input value of the bias input b. The output y of the neuron is determined by the activation function $f(x)$, where different function types may be used for the activation function depending on the respective network topology. A linear function, a sigmoid function, a piecewise linear function or a step function, for example, may be used as the activation function $f(x)$.

The transfer function $\Sigma$ and the activation function $f(x)$ must be calculated for the implementation of the functionality of an individual neuron, as shown, e.g., in FIG. 1b. Different calculation units (e.g., summators, multipliers or complex evaluating units) may be used for this purpose, for example, which are implemented by different circuit blocks on the basis of hardware in the case of a realization by means of an electronic integrated circuit (e.g. FPGA). Currently known implementations of artificial neurons or neural networks by means of electronic integrated circuit, in particular by means of an FPGA, are known from the following publications: Muthuramalingam, A, et al., *Neural Network Implementation Using FPGA: Issues and Application*, International Journal of Electrical and Computer Engineering Vol. 2, No. 12, 2008; Nurviadhi, E. et al.: *Accelerating Binarized Neural Networks: Comparison of FPGA, CPU, GPU and ASIC*, 2016, IEEE; or Haruyoshi Yonekawa and Hiroki Nakahara: On-chip Memory Based Binarized Convolutional Deep Neural Network Applying Batch Normalization Free Technique on an FPGA, 2017, IEEE p. 98-105.

Figure 2:
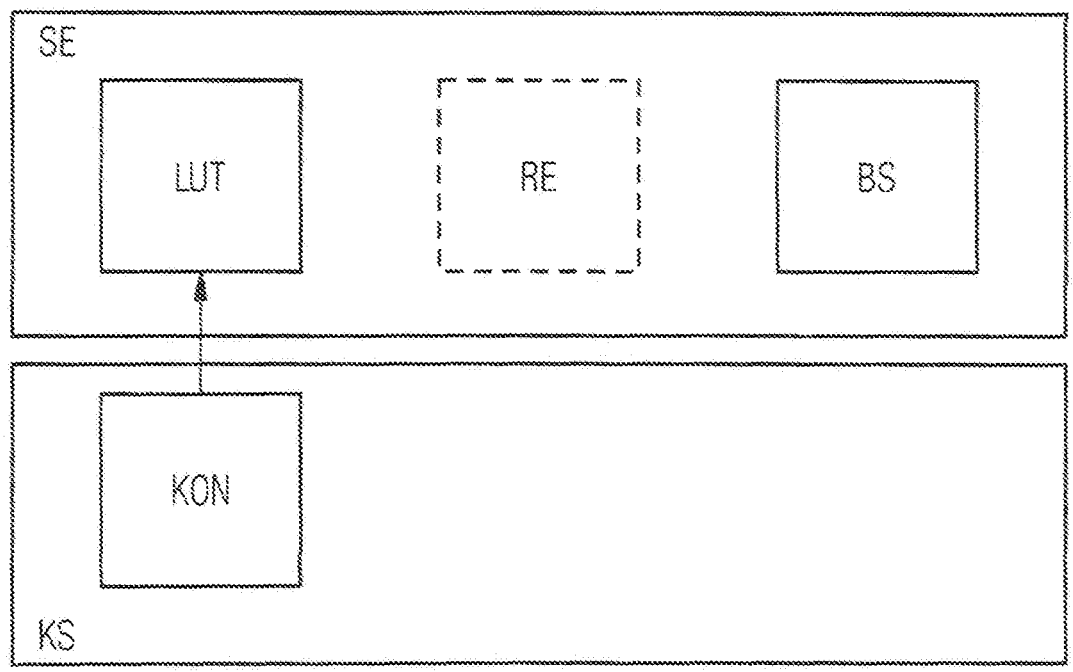
FIG. 2 shows an exemplary, schematic implementation of a neuron with dedicated memory block for associated weighting factors during a training phase.

As shown in simplified form and by way of example in FIG. 2, an artificial neuron realized nowadays on an electronic integrated circuit SE or on an FPGA may consist of at least, e.g., a lookup table or LUT unit LUT, and a memory block BS. Optionally a calculation unit RE may also be provided. A configuration cell KON belonging to the LUT unit LUT is used in the configuration memory KS of the electronic integrated circuit SE, for example, to configure the LUT unit LUT or to realize the function of the LUT unit LUT. In the case of neurons with complex functionality, multiple such units LUT, RE and BS as well as configuration cells KON assigned to the LUT units LUT may possibly be provided.

The transfer function $\Sigma$ and the activation function $f(x)$ are realized, e.g., in the training phase and in live operation via the LUT unit LUT and any calculation unit RE that may be present. For this purpose, for example, the function of the LUT unit is fixed and specified by the configuration of the LUT unit stored in the associated configuration cell KON. The calculation unit RE may be realized as a digital signal processor (DSP) or constructed from, e.g., gates, shift registers, summator units and/or multiplier units. The weighting w1, w2, w3, . . . , wn for the calculation of the network input of the neuron via the transfer function $\Sigma$ is provided by at least one block memory BS which may be formed, e.g., as block RAM or BRAM. The content of the at least one block memory BS, i.e., the respective weighting w1, w2, w3, . . . , wn of the respective neuron, may be changed for example during the training phase. That is, in order to train the neurons or neural network, the weighting w1, w2, w3, . . . , wn, which is stored in a dedicated memory block BS of at least one neuron, is modified. If an output result with the desired quality is obtained from the neural network during the training phase, then the weightings w1, w2, w3, . . . , wn stored in the respective memory blocks BS are fixed.

Figure 3:
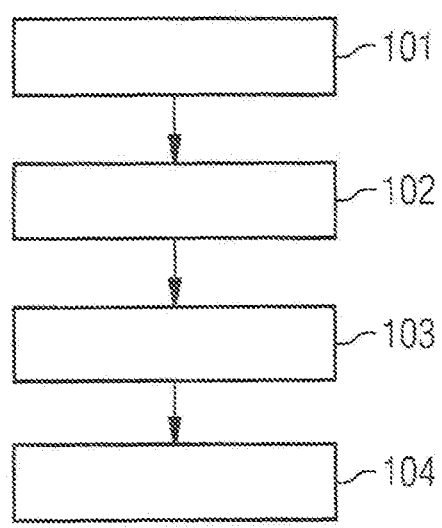
FIG. 3 shows a schematic sequence of the method in accordance with the invention for realizing an artificial neural network via an integrated electronic circuit.

FIG. 3 shows an exemplary and schematic sequence of the method in accordance with the invention for realizing an artificial neural network via an electronic integrated circuit SE formed, by way of example, as an FPGA. Here, the artificial neural network consists of neurons (as shown by way of example in FIG. 1b) which, as described by way of example with the aid of FIG. 1a, are grouped in layers and linked to each other. In a first step 101 of the method in accordance with the invention, a functional description is created for each neuron, where a specifiable starting weighting for the respective neuron is already taken into account in the functional description. The starting weighting that may be, for example, randomly selected or maximum possible values for the weighting w1, w2, w3, . . . , wn, may be used as the starting weighting. The functional description of the respective neuron is composed in, for example, a hardware description language (e.g., HDL, Very High Speed Integrated Circuit Hardware Description Language (VHDL), or Verilog).

In a second step 102, a synthesis is performed based on the respective functional description of the respective neuron, in which the respective associated starting weighting is specified or has been taken into account, and in a third step 103 a netlist is created or obtained as the synthesis result. That is, the functional description of the neurons or neural network, which is usually available in a hardware description language, is converted into a netlist. The netlist typically comprises a description of the modules necessary for realization of the circuit (e.g., logic gates or memory blocks) and the corresponding links between the modules. In the netlist created in the third step 103, at least one base element BE1 and a starting configuration belonging to the base element BE1 are then stored for each neuron.

Figure 4:
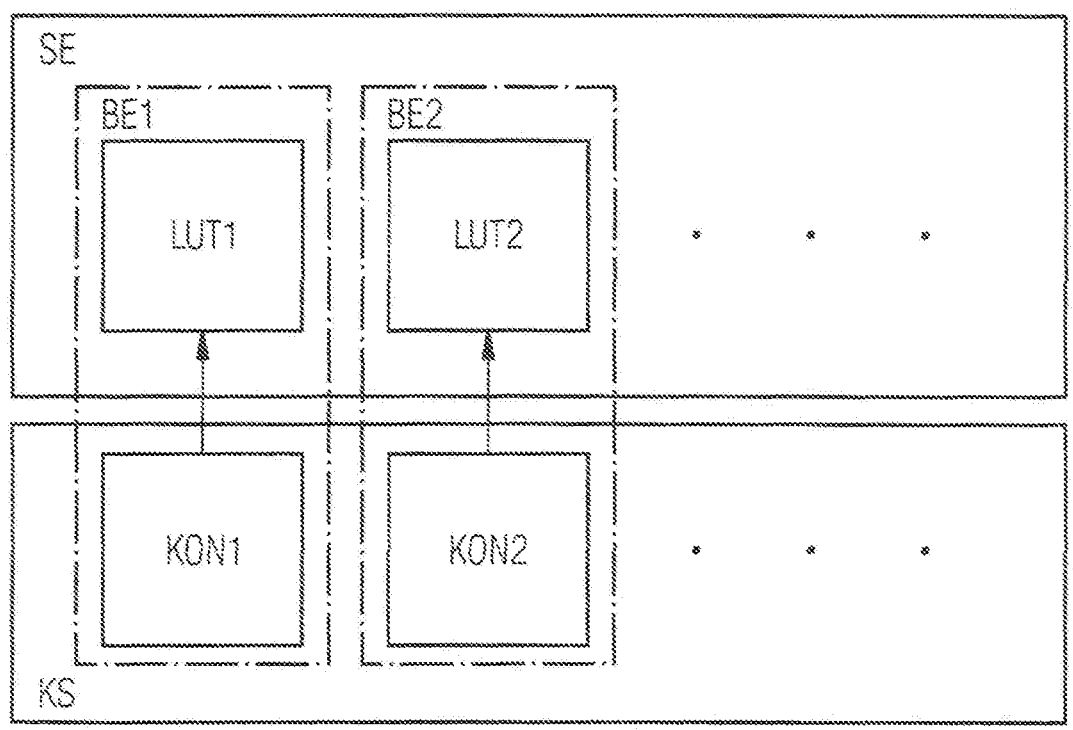
FIG. 4 shows an exemplary schematic representation of a base element for a neuron for use in the method in accordance with the invention.

A base element BE1 of this type is shown by way of example and schematically in FIG. 4. A neuron of a neural network realized in accordance with the method of the invention consists at least of one base element BE1 of this type. However, functionally more complex neurons may also have multiple base elements BE1, BE2, . . . . Ideally, however, in the first step 101, during the creation of the functional description, taking into account the respective starting weighting, the functionality of the respective neuron is reduced such that the respective neuron may be mapped onto precisely one base element BE1.

A base element BE1 of this type, via which a neuron may be formed, is formed from a LUT unit LUT1 on the electronic integrated circuit SE and an associated dynamic configuration cell KON1. A respective current configuration for the LUT unit LUT1 is stored in the dynamic configuration cell KON1. With this configuration, the function of the LUT unit LUT1 is determined from which, in principle, the transfer function are implemented, taking into account a weighting w1, w2, w3, . . . , wn, and the activation function f(x). A memory unit of the configuration memory KS of the electronic integrated circuit SE is used as the configuration cell KON1, for example, which may be formed as static RAM or Flash memory, for example.

In the case of a functionally more complex neuron, a further base unit BE2 may be provided, for example, which likewise consists of a further LUT unit LUT2 and a further associated dynamic configuration cell KON2 in which the respective current configuration for the further LUT unit LUT2 is stored. If, in the step 101, the neurons of the neural network are established via functional description such that each neuron is mapped only onto one base unit BE1, BE2, . . . , the further base unit BE2 may already represent a further neuron of the neural network.

In a fourth step 104, the netlist is loaded and implemented, as the starting configuration of the neural network, into the electronic integrated circuit SE or into the FPGA SE. Subsequently a training phase, ideally during online operation or directly on the circuit SE, may then be started.

For this purpose, when the circuit SE or FPGA is ramped up or started, for example, the starting configurations stored in the configuration cells KON1, KON2, . . . , are loaded into the LUT units LUT1, LUT2, . . . . In the training phase, fixed, specified test data and/or test samples are used to perform the task to be solved by the neural network (e.g., text recognition, image recognition or pattern recognition, decision-making or a classification task). The output data of the neural network obtained with the test data and/or test samples is then compared with specified reference data and a check is performed to determine whether the output data obtained corresponds to the reference data within a specifiable tolerance.

If the specifiable tolerance is exceeded or the desired conformity to the reference data is not achieved, then starting from the starting configuration, the respective current configuration is modified for at least one base element BE1, BE2, . . . and/or for at least one neuron. That is, the configuration of the respective associated LUT unit LUT1, LUT2, . . . stored in the respective configuration cell KON1, KON2, . . . is changed. In this process, by way of example, only the functional description for the respective neuron may be modified, or only the weighting w1, w2, w3, . . . , wn taken into account in the functional description for the neuron, or both. The modified configuration for the respective LUT unit LUT1, LUT2, . . . may be fed in, for example, via a specially designated interface of the electronic integrated circuit SE or FPGA SE (e.g., special interface of a manufacturer of the circuit or FPGA).

If the specifiable tolerance is achieved/not exceeded or the desired conformity is obtained between output data of the neural network and the reference data, then the respective current configurations of the LUT units LUT1, LUT2, . . . in the associated configuration cells KON1, KON2, . . . are fixed and the training phase is terminated.

In a neural network realized via the method in accordance with the invention, the respective neurons are realized via at least one respective base element BE1, BE2, where the function of the respective neuron is determined by the respective LUT unit LUT1, LUT2, . . . . Ideally, the functional content of the respective LUT unit LUT1, LUT2, . . . may be varied via the associated configuration cell KON1, KON2, . . . . The respective weighting w1, w2, w3, . . . , wn of the respective neuron is mapped indirectly in the function of the respective LUT unit LUT1, LUT2, . . . . As a result, a consumption of resources by the electronic integrated circuit or FPGA SE may be significantly reduced and the processing speed, in particular during the training phase, may be increased.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for realizing an artificial neural network via an electronic integrated circuit, the artificial neural network being formed from artificial neurons which are grouped into different layers and linked to each other, the method comprising:
  a. creating a functional description, taking into account a specifiable starting weighting for each neuron;
  b. performing a synthesis for each respective neuron based on a respective functional description with an associated specifiable starting weighting;
  c. creating a netlist as a synthesis result, at least one base element and a starting configuration belonging to the base element being stored in the netlist for each neuron, and the at least one base element being formed by a lookup table (LUT) unit and an associated dynamic configuration cell, in which a respective current configuration for the associated LUT unit is stored;
  d. implementing the netlist as a starting configuration of the artificial neural network in the electronic integrated circuit;
  wherein, starting from the starting configuration of the artificial neural network implemented in the electronic integrated circuit, a training phase of the artificial neural network is performed in which at least one of (i) the starting configuration and (ii) a respective current configuration of at least one of (i) at least one base element and (ii) at least one neuron is changed; and
  wherein at least one of (i) fixed, specified test data and (ii) test samples are utilized in the training phase of the artificial neural network, output data obtained with at least one of (i) the test data and (ii) test sample is compared with specified reference data, and a change to the respective current configuration of at least one of (i) at least one base unit and (ii) at least one neuron is performed iteratively until the output data obtained with at least one of (i) the test data and (ii) the specified test sample corresponds to the specified reference data within a specifiable tolerance.

2. The method as claimed in claim 1, wherein, during the creation of the functional description, taking into account the specifiable starting weighting of the respective neuron, the functionality of the respective neuron is reduced such that the respective neuron is mapped onto one base element.

3. The method as claimed in claim 1, wherein a specially designated interface of the electronic integrated circuit is utilized during the training phase of the artificial neural network to feed in a change to at least one of (i) the starting configuration and (ii) the respective current configuration of at least one of (i) the at least one base unit and (ii) the neuron.

4. The method as claimed in claim 1, wherein a memory unit of a configuration memory of the electronic integrated circuit is utilized as the configuration cell for storing the respective current configuration of the respective base element.

5. The method as claimed in claim 1, wherein that the configuration cell for storing the respective current configuration of the respective base element comprises static RAM.

6. The method as claimed in claim 1, wherein the electronic integrated circuit comprises a Field Programmable Gate Array (FPGA).

7. The method as claimed in claim 1, wherein the functional description of the respective neuron is created in a hardware description language (HDL).

\* \* \* \* \*